United States Patent
Claes et al.

(10) Patent No.: US 10,475,783 B2
(45) Date of Patent: Nov. 12, 2019

(54) ELECTROSTATIC DISCHARGE PROTECTION APPARATUSES

(71) Applicant: NXP B.V., Eindhoven (NL)

(72) Inventors: Jan Claes, Nijmegen (NL); Stephen John Sque, Veldhoven (GB); Maarten Jacobus Swanenberg, Berg en Dal (NL); Da-Wei Lai, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/783,232

(22) Filed: Oct. 13, 2017

(65) Prior Publication Data

US 2019/0115340 A1    Apr. 18, 2019

(51) Int. Cl.
| | | |
|---|---|---|
| *H01L 27/02* | (2006.01) | |
| *H01L 29/735* | (2006.01) | |
| *H01L 29/10* | (2006.01) | |
| *H01L 27/07* | (2006.01) | |

(52) U.S. Cl.
CPC ...... *H01L 27/0277* (2013.01); *H01L 27/0259* (2013.01); *H01L 27/0705* (2013.01); *H01L 29/1008* (2013.01); *H01L 29/735* (2013.01)

(58) Field of Classification Search
CPC ..... H01L 23/60; H01L 23/62; H01L 27/0277; H01L 27/0259; H01L 27/0705; H01L 29/1008; H01L 29/735
See application file for complete search history.

(56) References Cited

U.S. PATENT DOCUMENTS

| | | | |
|---|---|---|---|
| 4,442,448 A * | 4/1984 | Shimbo | H01L 27/0225 257/262 |
| 4,750,078 A | 6/1988 | Ganger et al. | |
| 6,030,864 A * | 2/2000 | Appel | H01L 21/8249 257/E21.696 |
| 7,408,751 B1 | 8/2008 | Lien et al. | |
| 9,019,670 B2 | 4/2015 | Steinhoff et al. | |
| 9,627,210 B2 * | 4/2017 | Wang | H01L 21/265 |
| 9,786,652 B2 * | 10/2017 | Zhan | H01L 27/0262 |
| 2004/0188841 A1 * | 9/2004 | Chen | H01L 23/60 257/758 |
| 2005/0212051 A1 * | 9/2005 | Jozwiak | H01L 27/0262 257/355 |
| 2011/0089532 A1 * | 4/2011 | Meiser | H01L 23/60 257/536 |

(Continued)

OTHER PUBLICATIONS

Tsung-Che Tsai, et al. "Novel Dual Direction PNP with Self-bias Ring Structure," IEEE 2014.

(Continued)

*Primary Examiner* — Edward Chin

(57) ABSTRACT

Various embodiments are directed to electrostatic discharge (ESD) protection apparatus comprising a bipolar junction transistor (BJT) having terminals, a field-effect transistor (FET) having terminals, and a common base region connected to a recombination region. The BJT and the FET are integrated with one another and include a common region that is shared by the BJT and the FET. The BJT and FET collectively bias the common base region and prevent triggering of the BJT by causing a potential of the common base region to follow a potential of one of the terminals of the BJT in response to an excessive but tolerable non-ESD voltage change at one or more of the terminals.

20 Claims, 6 Drawing Sheets

(56) References Cited

U.S. PATENT DOCUMENTS

2013/0208385 A1\* 8/2013 Salcedo ................ H01L 23/60
361/111
2014/0302647 A1 10/2014 Bobde

OTHER PUBLICATIONS

Extended European Search Report for Patent Appln. 18194936.3 (dated Feb. 14, 2019).

\* cited by examiner

ELECTROSTATIC DISCHARGE PROTECTION APPARATUSES

Aspects of various embodiments are directed to an electrostatic discharge (ESD) protection apparatus.

An ESD protection device can be used to provide protection to an apparatus from ESD events. Transients, such as ESD events, can cause a voltage-handling capability of an apparatus to be exceeded, and which can cause damage to circuitry of the apparatus. ESD protection devices can be used to shunt current to ground during ESD events. Various ESD protection devices can be uni-directional or bidirectional. Uni-directional devices provide ESD protection for either excessively positive voltages or excessively negative, but not both. Bidirectional ESD protection devices can provide protection for both positive and negative voltages associated with ESD events.

As with many integrated circuit designs, available circuit area (aka real estate) for the ESD protection circuitry is often an issue. This can be especially true when electrical specifications for the core operational circuit, for which ESD protection is intended, are complex or voluminous. Under these and other situations limiting circuit-area availability, the type of circuit used to provide ESD protection is sometimes selected based on availability of circuit area, as opposed to robustness of the ESD protection which might be provided by the ESD protection circuitry. For risk-intolerant core operational circuitry, compromising the robustness of the ESD protection is oftentimes not an option.

These and other matters have presented challenges to efficiencies of ESD protection implementations, for a variety of applications.

SUMMARY

Various example embodiments are directed to issues such as those addressed above and/or others which may become apparent from the following disclosure concerning ESD protection devices that prevent triggering of ESD protection by causing biasing of a common base region.

In certain example embodiments, aspects of the present disclosure involve an ESD protection apparatus that self-biases a common base region in order to prevent (or delay) triggering of ESD protection. The ESD protection apparatus can include a bipolar junction transistor (BJT) that provides ESD protection and the common base region of the apparatus is self-biased to prevent unwanted triggering of the BJT, responsive to excessive but tolerable non-ESD voltage changes that are within a normal-operation voltage range (and below an ESD trigger voltage for ESD protection), by causing a potential of the common base region to follow a potential of one of the terminals of the BJT. An ESD trigger voltage of such an apparatus can be limited by a breakdown of one of the PN junctions of the BJT rather than a turn-on of the BJT due to forward biasing of one of the PN junctions.

In specific example embodiments, an ESD protection apparatus includes a BJT integrated with a field-effect transistor (FET). The BJT has terminals including an emitter, a base, and a collector. The FET has terminals including a gate, a source, and a drain. The ESD protection apparatus further includes a common base region connected to a recombination region. The BJT and FET are integrated with one another and include a common region that is shared by the BJT and the FET. In specific aspects, the common region is a terminal shared by each of the BJT and the FET. The BJT and FET bias the common base region to prevent triggering (e.g., unwanted) of the BJT by causing a potential of the common base region to follow a potential of one of the terminals of the BJT in response to an excessive but tolerable non-ESD voltage change at one or more of the terminals. The common base region can be biased by activating the FET and flowing hole current to the recombination region, which causes the common base region to follow a potential of the terminal (e.g., the emitter) of the BJT. In some aspects, the ESD apparatus can include a lateral BJT that is integrated with the BJT. The lateral BJT can enhance the self-biasing of the common base region by contributing to the recombination region in addition to the FET, as further described herein.

In other related and specific example embodiments, an ESD protection apparatus includes a BJT that is integrated with a first FET and a second FET. The BJT has terminals including an emitter, a base, and a collector, and each of the first and second FETs have terminals including a gate, a source, and a drain. The ESD protection apparatus further includes a common base region connected to a first recombination region and a second recombination region. The BJT and the first FET are integrated with one another and include a first common region that is shared by the BJT and the first FET. The BJT and the first FET collectively bias the common base region to prevent triggering of the BJT by activating the first FET and causing a potential of the common base region to follow a potential of one of the terminals of the BJT in response to an excessive but tolerable non-ESD voltage change of a first polarity at the terminal of the BJT. The BJT and the second FET are integrated with one another and include a second common region that is shared by the BJT and the second FET, and can collectively bias the common base region to prevent triggering of the BJT by activating the second FET and causing the potential of the common base region to follow a potential of another of the terminals of the BJT in response to another excessive but tolerable non-ESD voltage change, of an opposite polarity as the (previous) excessive but tolerable non-ESD voltage change, at the terminal of the BJT. The other excessive but tolerable non-ESD voltage change can include a negative voltage and the (previous) excessive but tolerable non-ESD voltage change can include a positive voltage, or vice versa. As described above and further described herein, the ESD protection apparatus can further include first and second lateral BJTs that are integrated with the BJT and are respectively in parallel with the first FET and the second FET. The first and/or second lateral BJTs can enhance the self-biasing of the common base region by contributing to the recombination regions in addition to the first and/or second FETs.

In other specific example embodiments, an ESD protection apparatus includes a BJT integrated with a first FET and a first lateral BJT. The BJT and the first lateral BJT each have terminals including an emitter, a base, and a collector. The first FET has terminals including a gate, a source and a drain. The apparatus further includes a common base region connected to a first recombination region and that includes the base of the BJT. Further, the first recombination region is adjacent to one of the terminals of the first lateral BJT. The BJT, the first FET and the first lateral BJT are integrated with one another and include a first common region that is shared by the BJT, the first FET and the first lateral BJT. The BJT, the first FET and the first lateral BJT collectively bias the common base region and prevent triggering of the BJT by activating the first FET and causing the common base region potential to follow a potential of one of the terminals of the BJT in response to a first excessive but tolerable non-ESD voltage change of a first polarity at the terminal of the BJT.

In accordance with various embodiments, the first FET and the first lateral BJT collectively contribute to the first recombination region in response to the first excessive but tolerable non-ESD voltage change and thereby cause self-biasing of the common base region (and, optionally, the second FET and second lateral BJT collectively contribute to the second recombination region in response to a second excessive but tolerable non-ESD voltage change of an opposite polarity as the first polarity).

In some specific embodiments, the above-described apparatus can prevent triggering of the BJT in response to excessive but tolerable non-ESD voltage changes that are positive and negative, and during normal operation (e.g., associated with voltages below the ESD trigger voltage for each polarity). For example, the above-described ESD protection apparatus can further include a second FET and second lateral BJT integrated with the BJT. The second FET has terminals including a gate, a source and a drain, and the second lateral BJT has terminals including an emitter, a base and a collector. The common base region further includes the base of the first and second lateral BJTs, and is connected to a second recombination region. The second recombination region is adjacent to one of the terminals of the second lateral BJT. The BJT, the second FET and the second lateral BJT are integrated with one another and include a second common region that is shared by the BJT, the second FET and the second lateral BJT. The BJT, the second FET and the second lateral BJT collectively bias the common base region to prevent triggering of the BJT by activating the second FET and causing the common base region potential to follow a potential of another terminal of the BJT in response to a second excessive but tolerable non-ESD voltage change, of an opposite polarity as the first polarity, at the terminal of the BJT.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
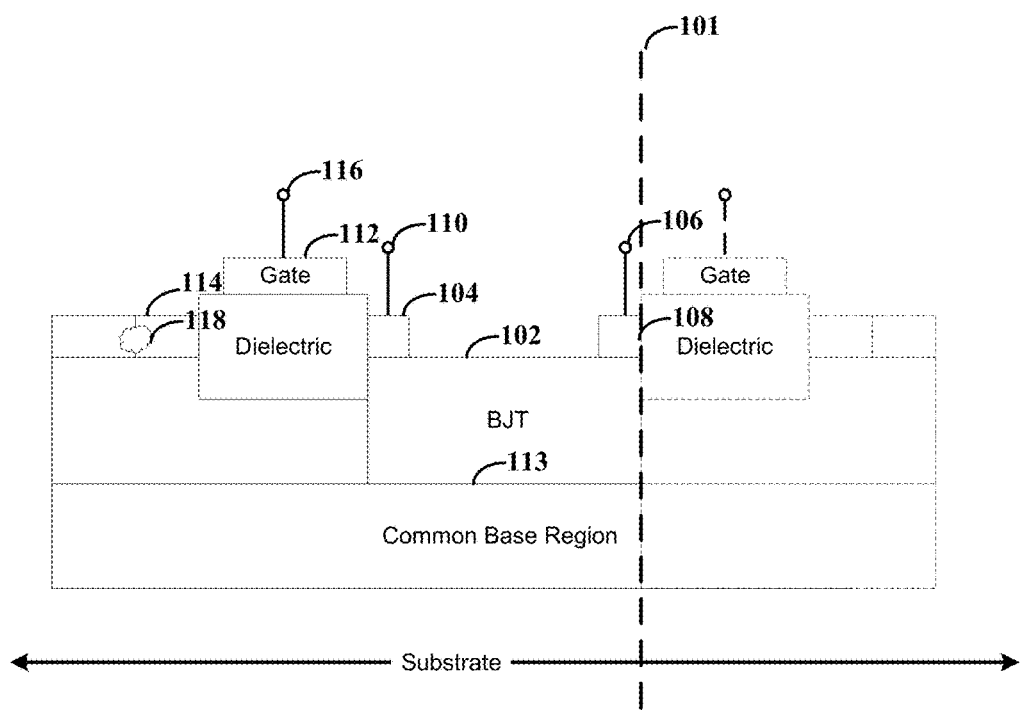
FIG. 1 is a diagram illustrating an example apparatus, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving an electrostatic discharge (ESD) protection apparatus that biases a common base region responsive to excessive but tolerable non-ESD voltage changes during normal operation in order to prevent or delay triggering of ESD protection by the apparatus. In certain implementations, aspects of the present disclosure have been shown to be beneficial when used in the context of an ESD protection apparatus that includes a bipolar junction transistor (BJT) used to protect the apparatus against ESD events that is integrated with one or more additional transistors used to self-bias a common base region to prevent triggering of the BJT responsive to the excessive but tolerable non-ESD voltage changes during normal operations. In some embodiments, the BJT is integrated with a field-effect transistor (FET) and a lateral BJT that each share a common region with the BJT and together cause the common base region potential to follow a potential of one of the terminals of the BJT in response to the excessive but tolerable non-ESD voltage change at the terminal of the BJT. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Embodiments in accordance with the present disclosure are directed to an ESD protection apparatus, such as an integrated circuit on a chip, that self-biases a common base region of the apparatus in order to prevent (or delay) triggering of ESD protection by the apparatus, such as by preventing triggering of the BJT in response to an excessive voltage change which is designed to be tolerated by the circuitry without a need to trigger ESD protection (herein sometimes referred to as "an excessive but tolerable non-ESD voltage change"). The ESD protection apparatus can include a main BJT that provides ESD protection to the apparatus. ESD protection by the main BJT may be triggered (which is sometimes herein referred to as "ESD triggering") by ESD events that reach (e.g., are greater or equal to) an ESD trigger voltage, which is designed into the circuitry to be greater than the excessive voltage change which can be tolerated by the circuitry. The main BJT may be prevented from triggering in response to voltages within a so-called normal-operation voltage range (e.g., the excessive but tolerable voltage changes, in terms of absolute values, which are less than the ESD trigger voltage) via the self-biasing of the common base region as disclosed herein. For example, the ESD protection apparatus can self-bias to prevent triggering of the main BJT in response to non-ESD events having corresponding voltages that are higher than or surpass typical voltages used for circuit operation but are still considered within normal operation because they are tolerable according to integrated circuit (FET/BJT) design (or design specification).

As a more specific example, and for clarification purposes, for a given integrated circuit design, an ESD trigger voltage may be set for events 1.5-3 times greater than non-ESD voltage events (say ±20 V events) at the I/O terminals pins as these later events, which are also herein sometimes referred to as "non-ESD events", might be considered normal operations, as they are within a normal-operation voltage range (e.g., voltages associated with normal operation). This follows because such voltage swings at the I/O terminals or pins reflect non-excessive voltage changes and are expected to be well within the integrated-circuit (FET/BJT) design specification. Such a normal-operation voltage range (which can include ±5 V, ±10V, ±20V, ±30 V, among other examples) can be less than the voltage that triggers ESD protection. For example, ESD events can often be thousands or several thousand volts, such as 5000 V.

As another particular example for clarification purposes, the ESD trigger voltage can be 35V for ESD protection and the typical voltages used for circuit operations can be 25V (e.g., ±25 V). The ESD trigger voltage can be for each polarity (e.g., +35V and −35V, although embodiments are not limited to symmetrical voltages and can include non-symmetrical voltages for each polarity, such as −34V and +32V), with voltages below the ESD trigger voltage being considered normal operation and voltages above the ESD trigger voltage being considered high-voltage events. When an ESD event occurs, ESD protection is triggered via the main BJT to protect the circuit from the ESD event (e.g., which is a high-voltage event). The main BJT is prevented from triggering for non-ESD events that are within the normal-operation voltage range (e.g., which are normal operation events that are below ±35 V in the particular example) and include voltage changes with an absolute value greater than the (e.g., excessive but-still-tolerable range) typical voltages used for circuit operations (e.g., greater than ±25 V in the particular example) via the self-biasing of the ESD protection apparatus.

In specific embodiments, the main BJT is integrated with one or more FETs and lateral BJTs, which are collectively used for biasing the common base region. The common base region, which is formed by a common base well layer and the base regions of the main BJT and integrated lateral BJTs, is self-biased by the main BJT and the FET (and in addition to a lateral BJT) of the apparatus by causing a potential of the common base region to follow a potential of one of the terminals of the main BJT responsive to excessive but tolerable non-ESD voltage changes, e.g., within a normal-operation voltage range but greater than typical voltages used for circuit operations. As the potential of the common base region follows a potential of a terminal of the main BJT, turn-on of the main BJT (e.g., turn-on of the BJT due to forward biasing of one of the PN junctions) can be prevented (or delayed). Furthermore, the voltage-handling capability of the apparatus may be limited by breakdown of the collector-base junction and/or, potentially, by punch-through of the base.

Apparatuses in accordance with the present disclosure can be used to prevent triggering of the main BJT for ESD protection responsive to excessive but tolerable non-ESD voltage changes, such as bi-directional prevention or delay for both positive and negative voltage changes or uni-directional prevention or delay of the main BJT during normal operation. In some embodiments, a BJT that has a floating base can be used. The BJT, which is sometimes herein referred to as the "main BJT" for differentiation and/or clarification purposes, is integrated with at least one FET and collectively used to bias the common base region and prevent triggering of the BJT by causing a potential of the common base region to follow a potential of a terminal of the BJT in response to normal operating voltages (e.g., an excessive but tolerable non-ESD voltage changes). A common base region can include a base layer or well that is (directly or in directly) connected to the base region of the BJT and the recombination region. In various embodiments, the common base region (e.g., the base layer or well) and the connected base region(s) of the BJT(s) can collectively be referred to as the common base region. The common base region is self-biased using the FET (and optionally additional components as further described herein). As is conventional, FET terminals are referred to as a gate, a source and a drain, and BJT terminals are referred to as a base, emitter and collector. The BJT and FET are integrated with one another and include a common region (e.g., a terminal) that is shared by both the BJT and the FET. Collectively, the BJT and the FET can cause a potential of the common base region to follow a potential of the emitter or collector of the BJT in response to an excessive but tolerable non-ESD voltage change (that is below the ESD trigger voltage, greater than typical voltages used for circuit operations, and within the normal-operation threshold voltage) at the emitter of the BJT.

In various related and more specific embodiments, an apparatus includes the main BJT that is integrated with the FET, as described above, and that further includes a lateral BJT adjacent to the main BJT and that shares a base region with the main BJT and also shares the common region with the main BJT and the FET. The lateral BJT can have a shorted region, which abuts a PN junction forming a recombination region connected to the common base region. The lateral BJT in combination with the FET and the recombination region can be used to bias (rapidly) the common base region and thereby prevent (or delay) triggering of the BJT. In specific embodiments, the common base region includes a common base well layer (or region) that is (directly or indirectly) in contact with the base regions of both the main BJT and the lateral BJT to form the common base region that is self-biased.

As illustrated and described throughout this disclosure, the ESD protection apparatus can be uni-directional (e.g., responding to positive or negative excessive but tolerable non-ESD voltage changes only) or bi-directional. A uni-directional ESD protection device can include one FET and one lateral BJT. A bi-directional ESD protection device can include two FETs and two lateral BJTs. For example, the main BJT can be integrated with the two FETs and the two lateral BJTs.

Turning now to the figures, FIG. 1 is a diagram illustrating an example ESD protection apparatus, in accordance with the present disclosure. The components to the left of the dashed line 101 illustrate components of a uni-directional ESD protection apparatus. Optionally, a bi-directional ESD protection apparatus can include all components illustrated by FIG. 1 including those to the left and right of the dashed line 101.

As illustrated by FIG. 1, the apparatus can include a BJT 102 that is integrated with a FET. The BJT 102 has terminals 104, 108 including an emitter, a base, and a collector. The base may not be externally connected, and can be referred to as floating or has a high-impedance load. One of the terminals (e.g., the emitter/common region 104) can be connected to an input/output (I/O) terminal or I/O pin 110 and another terminal 108 (e.g., the collector) can be connected to ground via another terminal or pin 106. The FET has terminals including a gate 112, a source or common region 104, and a drain 114. The gate 112 can be connected to ground via a terminal or pin 116. The BJT 102 and the FET are integrated together and include a common region 104 that is shared by both the BJT 102 and the FET. The source or common region 104 can include a terminal that is shared by each of the BJT 102 and the FET, such as a terminal that is both the emitter of the BJT 102 and the source of the FET, in some embodiments.

The BJT 102 can respond to ESD events by providing ESD protection. As previously discussed, triggering of the BJT 102 (for providing ESD protection to the apparatus) for excessive but tolerable non-ESD voltage changes during normal operation, e.g., within a normal-operation voltage range, can be prevented or delayed by self-biasing a common base region 113 connected to a recombination region 118. The common base region 113 can be formed by the common base well layer (or region) and the base region of the BJT 102. As further illustrated herein, the common base region 113 can be connected to the recombination region 118 and base regions of one or more integrated lateral BJTs via regions that are doped the same as the common base well layer. The BJT 102 and the FET collectively prevent triggering of the BJT 102, in response to an excessive but tolerable non-ESD voltage change at one or more of the terminals, by causing a potential of the common base region 113 to a follow a potential of one of the terminals, e.g., the common region 104. For example, responsive to the excessive but tolerable non-ESD voltage change at the terminal (e.g., common region 104) of the BJT 102, the potential of the common base region 113, including the common base well layer and the base of the BJT 102, follows a potential of the terminal (e.g., the common region 104) of the BJT 102 in order to prevent (or delay) triggering of the BJT 102.

In various embodiments, although not illustrated by FIG. 1, the apparatus further includes a lateral BJT. The lateral BJT has terminals including an emitter, a base, and a collector, and shares the common region 104 with the BJT 102 and the FET. The lateral BJT is integrated with the BJT 102 and is parallel with the FET. For example, the base of the lateral BJT can be located beneath the dielectric of the FET, as further illustrated and described herein. The recombination region 118 is adjacent to one of the terminals of the lateral BJT. Further, the common base region 113 includes the base region of the lateral BJT (in addition to the common base well layer and the base region of the BJT 102). The recombination region 118 can be formed at a junction between P and N regions and is adjacent to the lateral BJT. More specifically, one of the terminals of the lateral BJT is the common region 104 that is collectively shared by the BJT 102, the FET, and the lateral BJT and the other terminal (e.g., 114) is in contact with one of the P and N region.

Other more specific embodiments are directed to a bi-directional ESD protection apparatus. As previously described, a bi-directional ESD protection apparatus can include all components illustrated by FIG. 1 including those to the left and right of the dashed line 101. As a specific embodiment, the component to the left of the dashed line 101 can be configured to respond to a positive excessive but tolerable non-ESD voltage change, and the BJT 102 and the components to the right of the dashed line 101 can be configured to respond to a negative excessive but tolerable non-ESD voltage change.

In specific embodiments, the components to the right of the dashed line 101 include another FET having terminals including a gate, a source and a drain. The BJT 102 and the other FET are integrated with one another and include another common region 108 that is shared by the BJT 102 and the other FET. The BJT 102 and the other FET can collectively bias the common base region 113 (e.g., the common base well layer and base region of the BJT 102) to prevent triggering of the BJT 102, by causing the potential of the common base region 113 to follow a potential of another terminal (e.g., the other common region 108) of the BJT 102 in response to another excessive but tolerable non-ESD voltage change, of an opposite polarity, at the one or more terminals. The other excessive but tolerable non-ESD voltage change can be an opposite polarity as the (previous) excessive but tolerable non-ESD voltage change (e.g., positive and negative voltages). The FET on the left side of the dashed line 101 is activated responsive to a first polarity (e.g., positive) voltage and the other FET on the right side of the dashed line 101 is activated responsive to an opposite polarity (e.g., negative) voltage of the first polarity. To selectively activate the FETs, the gate 112 of the FET is connected to ground via a terminal or pin 116 and the gate of the other FET is connected to an input/output (IO) terminal or pin that receives an input/output voltage corresponding to the respective excessive but tolerable non-ESD voltage changes and/or ESD events, as further described herein.

As with the left side of the dashed line 101, the components of the apparatus on the right side of the dashed line 101 can further include another lateral BJT having terminals including an emitter, a base, and a collector. The other lateral BJT can share the other common region 108 with the BJT 102 and the other FET. Similarly, the other lateral BJT is integrated with the BJT 102 and is parallel with the other FET. For example, the base of the other lateral BJT can be located beneath the dielectric of the other FET. Another recombination region can be adjacent to one of the terminals of the other lateral BJT. The common base region 113 can include the base region of the lateral BJT, the other lateral BJT, and the BJT 102, in addition to the common base well layer, as further described herein. As may be appreciated, the main BJT 102 and the lateral BJTs can each be considered and referred to as lateral BJTs as the current flows horizontally in each respective BJT. However, for clarity purposes, the BJT 102 is sometimes referred to as the BJT or main BJT. The lateral BJTs are located laterally to the main BJT 102 and beneath the FETs, and are referred to as "lateral BJT" for clarification purposes.

In various embodiments, as further illustrated herein, the BJT 102 is a PNP-type transistor, the FET is a P-type FET, and the common base region 113 including the common base well layer) is n-doped. In other embodiments, the BJT 102 is an NPN-type transistor, the FET is an N-type FET, and the common base region is p-doped.

Figure 2A:
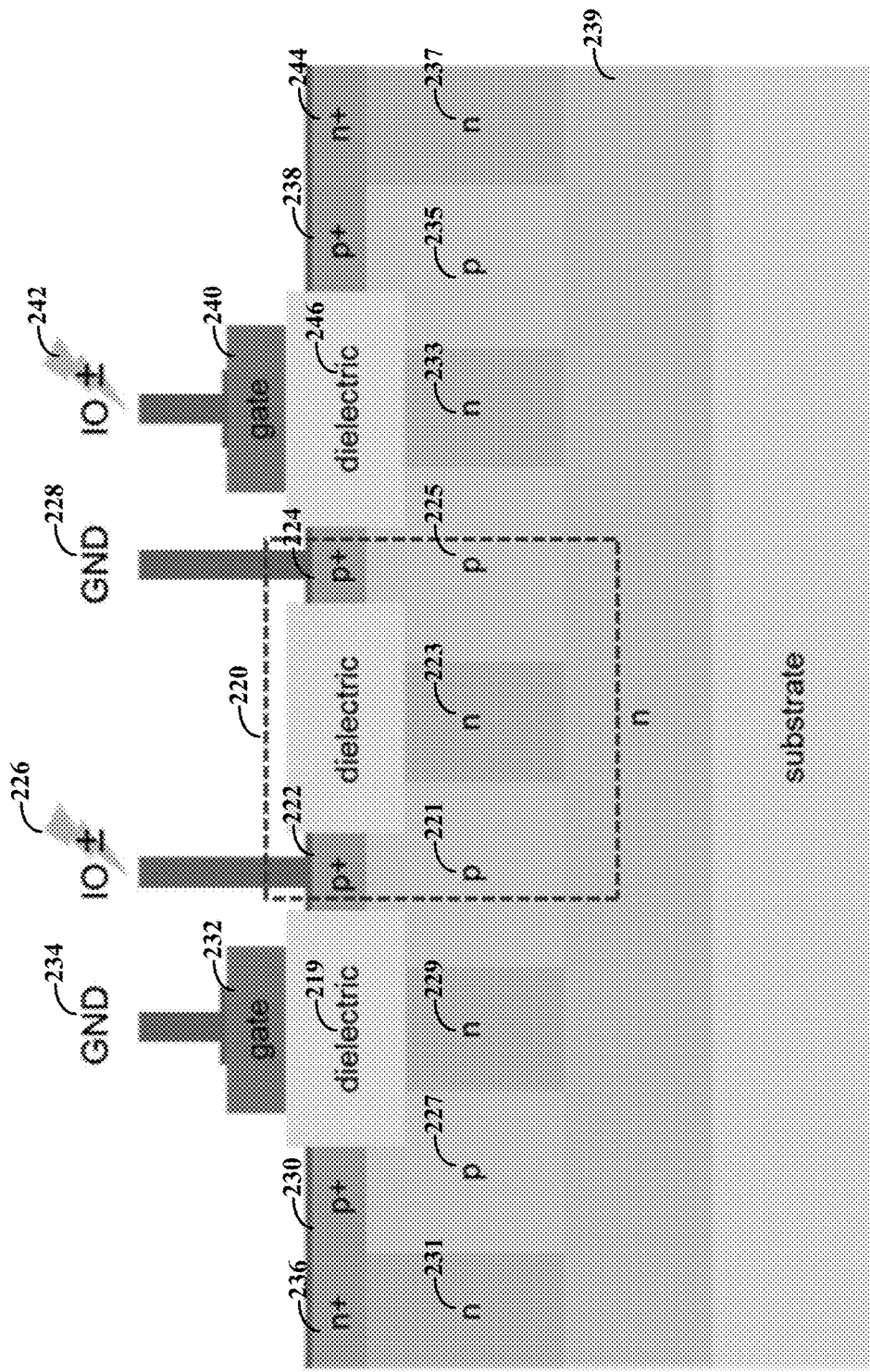
FIGS. 2A-2C is a diagram illustrating an example bi-directional apparatus and example operating principles of the apparatus illustrated by FIG. 2A, in accordance with the present disclosure.
Figure 2B:
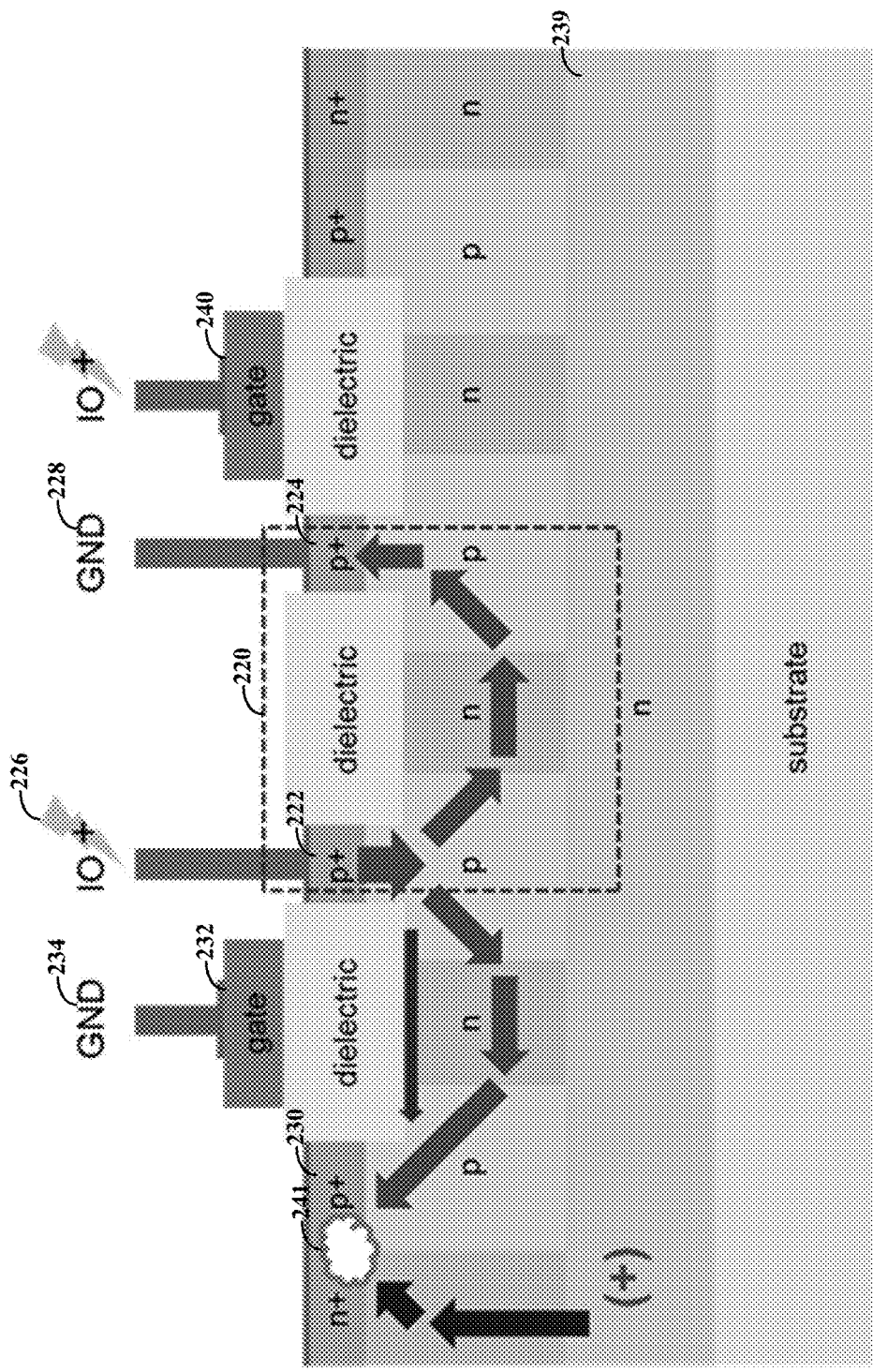
Figure 2C:
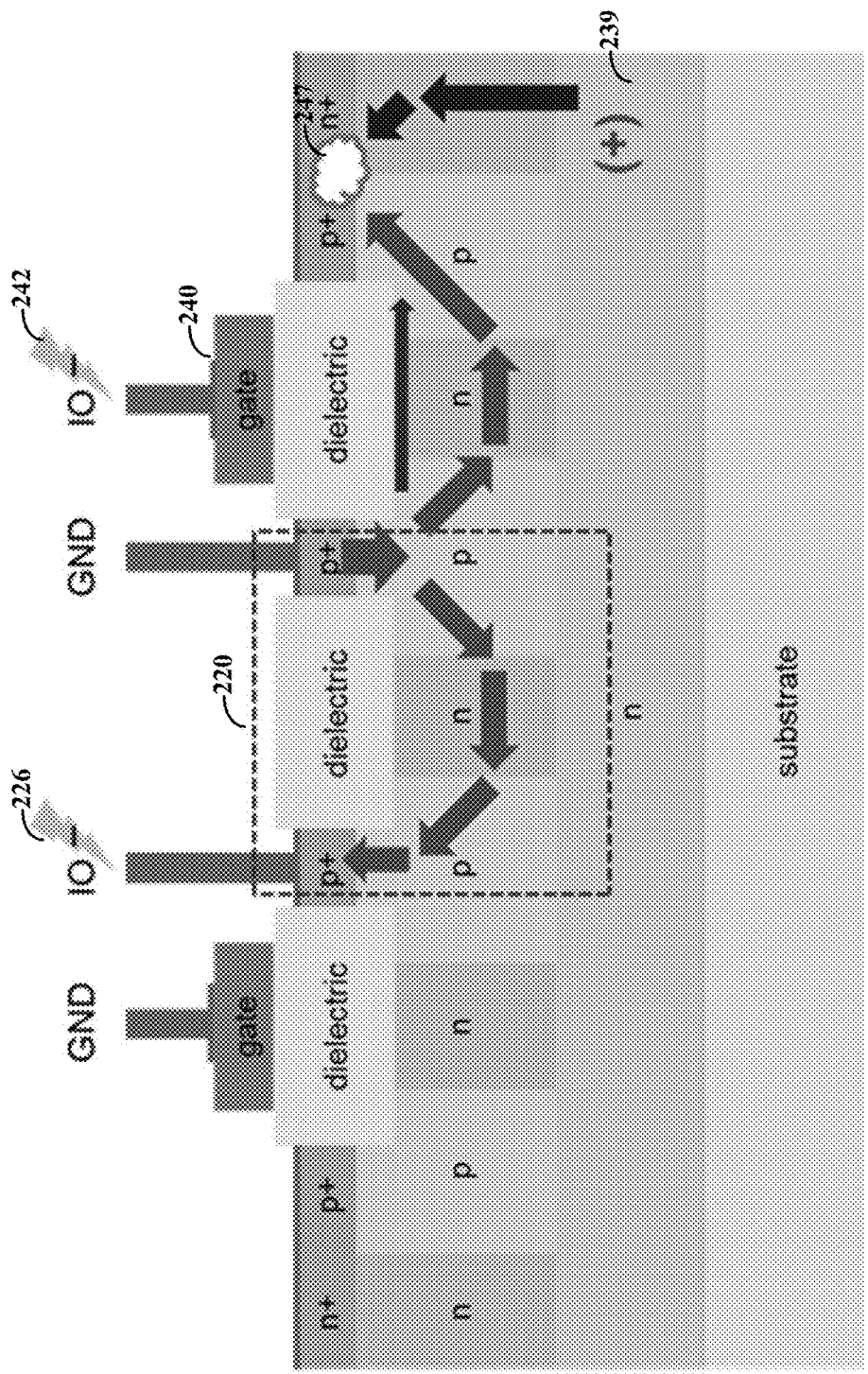

FIGS. 2A-2C is a diagram illustrating an example bi-directional ESD protection apparatus and example operating principles of the apparatus illustrated by FIG. 2A, in accordance with the present disclosure. The ESD protection apparatus illustrated by FIGS. 2A-2C can respond to excessive but tolerable non-ESD voltage changes that include both positive and negative voltages.

The apparatus includes a main BJT 220, as previously discussed. The main BJT 220 illustrated by the example embodiment of FIG. 2A includes a PNP bipolar transistor having regions 221, 223, 225 with alternating doping (e.g., p-n-p). The main BJT 220 has three terminals including a collector 224, a base (e.g., base region 223, which is floating), and an emitter (e.g., common region 222). One of the terminals, the emitter (e.g., common region 222) in this embodiment, is connected to an input/output (I/O) terminal or pin 226 configured to receive a positive or negative voltage corresponding to or caused by excessive but tolerable non-ESD voltage changes and/or ESD events. The other terminal, the collector (e.g., another common region 224) in this embodiment, is connected to ground via a terminal or pin 228 and the base 223 may not be externally connected.

On both the left (emitter-) side and right (collector-) side of the main BJT 220, the illustrated circuitry includes a first lateral BJT (e.g., regions 227, 229, 221) and a second lateral BJT (e.g., regions 225, 233, 235). The lateral BJTs also have regions with alternating doping (e.g., p-n-p) and include three terminals, e.g., a collector, a base, and an emitter. The first and second lateral BJTs can each respectively share a region with the main BJT 220. For example, the p-type region 221 is shared by the main BJT 220 and the first lateral BJT, and the p-type region 225 is shared by the main BJT 220 and the second lateral BJT. The first and second lateral BJTs can each also share the common region (e.g., terminals/common regions 222 and 224) with the main BJT 220 and the FETs (as further described herein). The first lateral BJT, on the left, is a PNP bipolar transistor that shares the same emitter (e.g., common region 222) as the main BJT 220 (and which is shared with the FET on the left side), and on the right side is a PNP bipolar transistor that shares the same collector (e.g., the common region 224) as the main BJT 220 (and which is shared with the FET on the right side). Accordingly and consistent with various example embodiments contemplated for the present disclosure, the first lateral BJT is adjacent to an emitter side of the main BJT 220, and the common region 222 is shared by the FET, the BJT 220 and the first lateral BJT. The second lateral BJT is adjacent to a collector side of the BJT 220, and the other common region 224 is shared by the other FET, the BJT 220 and the second lateral BJT.

The other p-type (collector/emitter) terminals of the first and second lateral BJTs (e.g., terminals 230 and 238) can be shorted to n-type regions 236, 244 (and optionally regions 231, 237) at the surface via abutted p+/n+ regions (and, for example, silicidation of the surface) in so-called "recombination regions". The n-type regions are contiguous in that together they comprise the base common to all three illustrated BJTs, herein referred to as the common base region as depicted by the use of the common base well layer 239 (e.g., a blanket deep n-type well). In specific embodiments, the common base well layer (or region) 239 can be in contact with the base regions 229, 223, 233 of each BJT and the recombination regions, which form a common base region that can be self-biased via the main BJT 220 and respective sets of FETs and lateral BJTs. This contact with the base regions can be direct or an effective electrical (indirect) contact via n-type regions 231, 237.

As previously described, the apparatus further includes FETs that are integrated with the main BJT 220 and are arranged in parallel with one of lateral BJTs. Each FET has terminals including a gate 232/240, a source (e.g., common regions 222/224), and a drain 230/238. Further, each FET shares the common region with the main BJT 220. The common regions 222, 224 can include a terminal that is shared between the main BJT 220 and each respective FET. For example, each FET has a source that is also the emitter of the main BJT 220 depending on the polarity of the voltage changes, e.g., common regions 222 and 224 that are terminals. The common region 222 (e.g., emitter and source terminal) on the left side is connected to an I/O terminal or pin 226 that receives the positive or negative voltage associated with the excessive but tolerable non-ESD voltage changes and/or ESD events. The common region 224 (e.g., emitter and source terminal) on the right side is connected to ground via a terminal or pin 228.

As further illustrated, gates (e.g., gate electrodes) 232, 240 are placed above the n-type base regions 229, 233 of the lateral BJTs (with no such gate placed above the base region 223 of the main BJT 220) and are separated from the semiconductor (e.g., silicon) by a dielectric 219, 246 (e.g., field oxide in some specific embodiments). In some embodiments, the FETs can be p-type metal-oxide-semiconductor FETs (MOSFETs) in parallel with the lateral BJTs. The gate 232 of the emitter-side (left) FET is connected to ground via a terminal or pin 234, while the gate 240 of the other (collector-side, right) FET is connected to an I/O terminal or pin 242.

FIG. 2B illustrates an example operating principle of the apparatus illustrated by FIG. 2A and in response to a positive excessive but tolerable non-ESD voltage change. Responsive to a positive voltage on the I/O terminal or pin 226, hole current (or hole-type charge carriers) flows through the main BJT 220 from its emitter (e.g., the common region 222) to its collector (e.g., other common region 224), which in this example illustration is at ground via the terminal or pin 228. Initially, hole current flows through the left-side lateral BJT (underneath the grounded gate 232 of the FET) to its collector 230 at the recombination region 241. These holes then recombine with electrons at the shorted p+/n+ junction of the recombination region 241. This recombination effect starves the n-type base region (e.g., the common base region formed by the common base well layer 239 and base regions of the lateral BJTs) of electrons. With this region being otherwise unconnected, electron flow into the region (to replace those lost to recombination) is mitigated or prevented. In turn, the base potential rises. This process continues until the common base region (formed by the common base well layer 239 and base regions of the main BJT and lateral BJTs) potential reaches the emitter (e.g., I/O) potential. Via this mechanism, the base potential follows the I/O voltage upwards if the latter continues to increase (e.g., following the potential of the emitter of the main BJT 220).

By having the base potential follow the positive emitter potential, forward turn-on of the main BJT 220 is prevented, and the voltage-handling capability of the apparatus can be limited only by the breakdown of the collector-base junction and/or, potentially, by punch-through of the base. In other words, the ESD protection apparatus in accordance with various embodiments can handle higher voltages without triggering ESD protection (and can be used to protect high-voltage devices), or rather the apparatus can be made smaller for a given voltage rating.

During the transient period (e.g., as the common base region potential is rising up to match the emitter potential), once the emitter (e.g., common region 222) of the main BJT 220 and common base region (e.g., common base well layer 239 and connected n-type regions) potentials have risen sufficiently, the left-hand FET turns on, since it's source (e.g., the common region 222 which also is the main BJT emitter) and body (the lateral BJT base) are higher in potential than its (grounded) gate 232. Hole current thereby also flows through this FET from right to left, in parallel with the lateral BJT current flowing underneath. This enhances the flow of holes to the recombination region 241, thus increasing the amount of recombination (i.e., electrons lost by the common base region), and increasing the rate at which the common base region potential can rise up to follow the increasing I/O voltage as compared to using the lateral BJT or FET alone. In this way, the "self-biasing" of the common base region via the action of the lateral BJT and recombination region 241, can be said to be transistor-assisted by the FET. The flow of holes through the lateral BJT and FET (e.g., the p-type MOSFET) can continue until the regional potentials have become sufficiently close to the I/O voltage, at which point further conduction in this direction is impeded. The right-hand FET (e.g., p-type MOSFET), meanwhile, is turned off by the positive voltage on the gate 240 (which is connected to the I/O pin), hence no current flows on this side.

FIG. 2C illustrates an example operating principle of the apparatus illustrated by FIG. 2A and in response to a negative excessive but tolerable non-ESD voltage. More specifically, the combination of FIGS. 2B and 2C illustrate the lateral symmetry of the overall structure. The apparatus works in a similar way when there is a negative voltage on the I/O terminal or pin, as illustrated by FIG. 2C.

In response to a negative excessive but tolerable non-ESD voltage change, the negative voltage on the I/O terminal or pin 226 pulls hole current through the main BJT 220 and pulls the common base region (e.g., common base well layer 239 and connected n-type regions) potential down. Hole current can flow through the right-hand lateral BJT and (in this embodiment) through the right-hand FET (e.g., p-type MOSFET) in parallel, and the holes recombine with electrons in the right-hand recombination region 247. Again, this starves the common base region of electrons, hence the base potential (which has been pulled negative) can rise until it is roughly back at ground (at which point the lateral BJT and FET action stops). By keeping the base close to ground (e.g., following or matching the main BJT collector potential) like this, the turn-on of the main BJT 220 is prevented or delayed, and the apparatus is limited only by breakdown of the emitter-base junction.

Although the embodiments of FIGS. 2A-2C illustrate PNP-type BJTs and p-type MOSFETs, embodiments are not so limited. For example, the main BJT and lateral BJTs can be NPN-type BJTs and the FETs can be n-type MOSFETs. Furthermore, embodiments are not limited to a bi-directional ESD apparatus.

Figure 3:
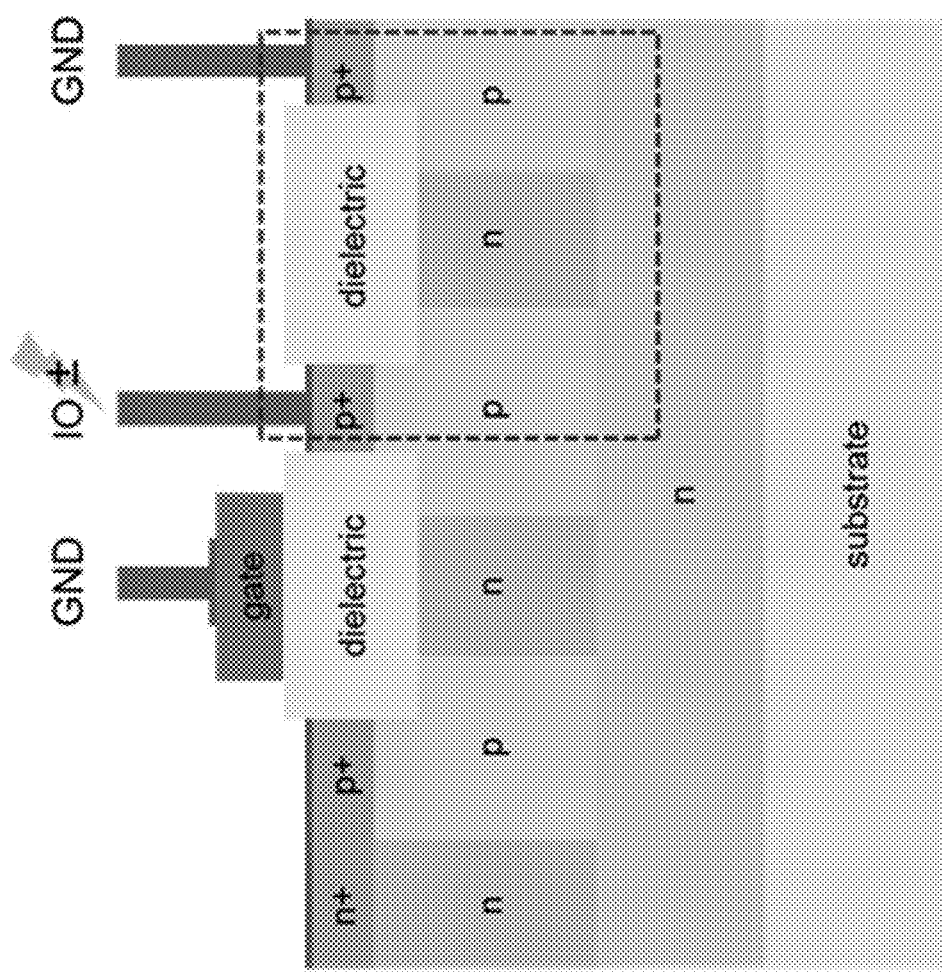
FIG. 3 is a diagram illustrating an example apparatus, in accordance with the present disclosure.

FIG. 3 is a diagram which illustrates an example ESD protection apparatus, in accordance with the present disclosure. In many implementations, in a PNP-based ESD protection apparatus on a p-type substrate such illustrated by FIGS. 2A-3, the forward ESD trigger voltage (e.g., for positive I/O voltages) is less (e.g., closer to zero) than the reverse ESD trigger voltage (e.g., for negative I/O voltages) due to the capacitive coupling between the grounded p-type substrate and the n-type common base region (this may not be the case if the substrate is floating). In various embodiments, an ESD protection apparatus can be uni-directional as it can be sufficient to prevent triggering for only forward turn-on of the apparatus. The reverse turn-on may not necessarily be a concern. In such embodiments, only the emitter-side lateral BJT and FET are included in the apparatus. Such an 'asymmetric' (or "one-sided") apparatus is illustrated by FIG. 3. A uni-directional apparatus can operate in the same manner as previously illustrated and described by FIG. 2B.

Figure 4:
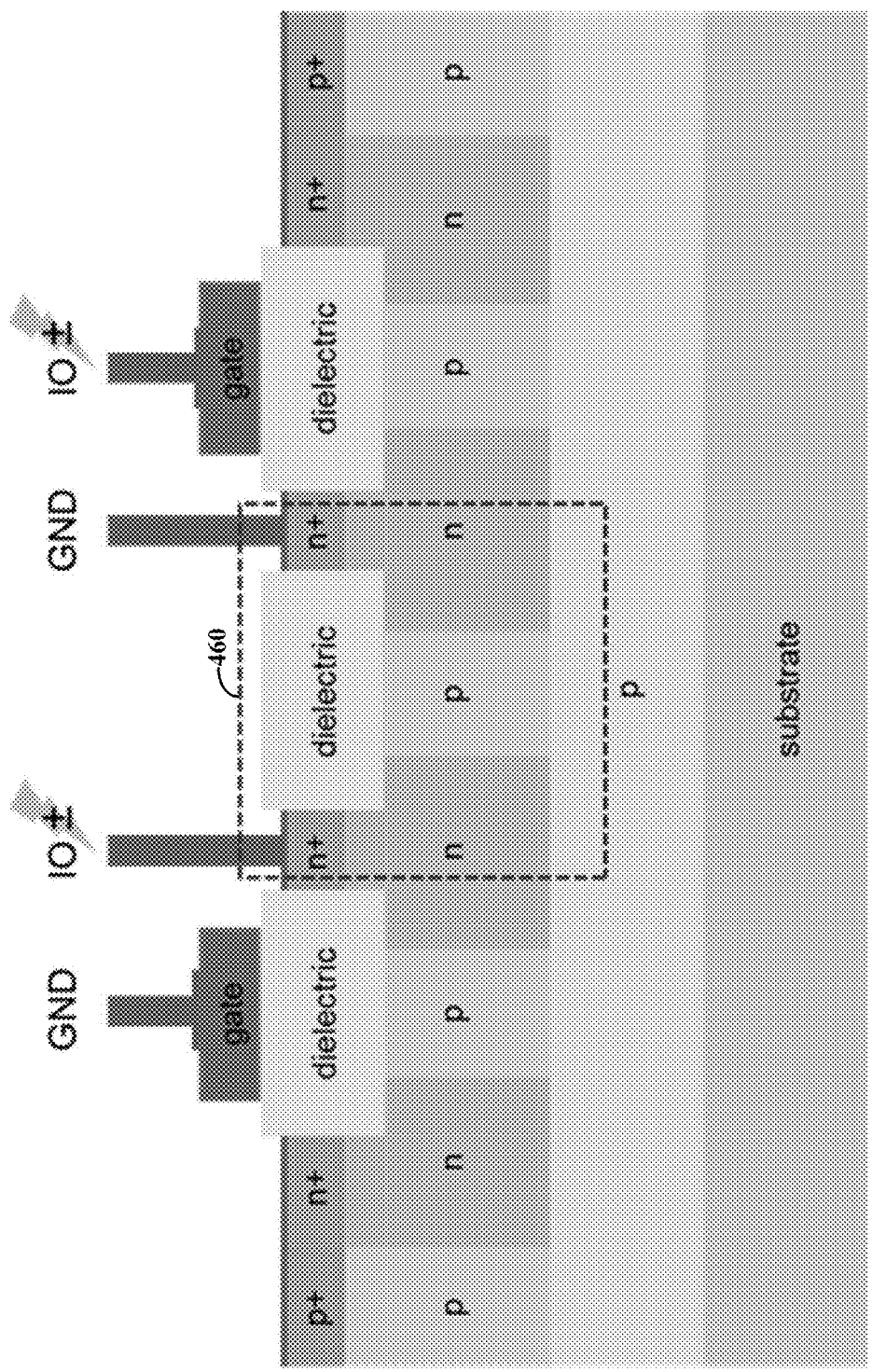
FIG. 4 is a diagram illustrating an example apparatus, in accordance with the present disclosure.

FIG. 4 is a diagram illustrating an example ESD protection apparatus in accordance with the present disclosure. As previously described, various embodiments include a main BJT 460 and the at least one lateral BJT are NPN-type BJTs. In such embodiments, the one or more FETs that are parallel to the lateral BJT(s) and integrated with the main BJT 460, include n-type FETs (e.g., n-type MOSFETs). FIG. 4 illustrates such an example apparatus. As would be appreciated by one of ordinary skill, such apparatuses operate similarly to that as described above but with electrons/holes and voltage polarities swapped as appropriate). The doping polarity of the regions illustrated by FIG. 4 is inverted from that illustrated by FIG. 2A. In such embodiments, the substrate can be either be an n-type semiconducting wafer or a deep n-well in a p-type semiconducting (e.g., silicon) wafer. Furthermore, such apparatuses can be uni-directional or two-directional, as previously described.

Various embodiments in accordance with the present disclosure include ESD protection apparatus that surprisingly allow for self-biasing of the ESD protection apparatus to prevent triggering of the BJT responsive to events resulting in excessive but tolerable non-ESD voltage changes that are within a normal-operation voltage range. The ESD protection apparatuses integrate one or more FETs with the main BJT and utilize recombination regions with the integrated FETs for self-biasing action. The lateral BJT(s) are used to enhance this self-biasing action by contributing to the recombination regions. The integration/merging of these transistors and their connection via recombination regions can occur without any external connections. Such operations can occur for example, due to the biasing (e.g., lateral BJT and FETs) transistors, their integration/merging with the main BJT (sharing the emitter/collector and source regions), and the use of recombination regions for connecting to the common base region, such as for non-ESD events that are high but considered normal operation since they are tolerable under typically integrated-circuit (FET/BJT) design specifications. For example, ±20 V events might be considered a voltage-threshold under normal operation because such voltage swings at the I/O terminals or pins are expected to be well within integrated-circuit (FET/BJT) design specifications. Accordingly, by self-biasing the ESD protection apparatus, triggering of the BJT is prevented in response to relatively high voltages at the I/O terminals or pins, for voltages which are at or within such a normal-operation voltage range. More specifically, the non-ESD events are less than the ESD trigger voltage set for the BJT to become activated for ESD protection and surpass typical voltages used for circuit operations.

Terms to exemplify orientation, such as lateral/horizontal, upper/lower, left/right, top/bottom, above/below, and beneath, may be used herein to refer to relative positions of elements as shown in the figures for the purpose of describing example embodiments. It should be understood that the terminology is used for notational convenience only and that in actual use the disclosed structures may be oriented different from the orientation shown in the figures. Thus, the terms should not be construed in a limiting manner.

For the purposes of this document, the skilled artisan would appreciated the following regarding the terms used herein: a) main bipolar junction transistor (sometimes referred to as "BJT"): BJT that is triggered to protect an apparatus from an ESD event that reaches, e.g., is equal to or greater than, a ESD trigger voltage; b) lateral BJT: one or more BJTs that are integrated with the main BJT and a FET, and are collectively used to bias an associated common base region; c) common region: portion of the semiconductor circuit that is shared by two or more transistors, such as a terminal that is both an emitter and a source or a base region that is shared by two BJTs; d) common base well layer (or region): layer or region of the semiconductor circuit (e.g., over the substrate layer) that connects, directly or indirectly, base regions of the transistor(s) and the recombination region; e) common base region: at least one region doped for a particular polarity such as n-type or p-type, to form a portion of the semiconductor corresponding to a base which is common to multiple transistors or BJTs as exemplified by contiguously-adjacent base regions for adjacent BJTs; f) recombination region: region of the semiconductor circuit in which electrons are recombined with holes; g) ESD event: sudden flow of electricity between two electrically charged objects caused by contact, an electrical short, and/or dielectric breakdown; and h) ESD trigger voltage: voltage that activates ESD protection by the apparatus, e.g., the ESD trigger voltage of example ESD protection circuits can be limited by a breakdown of one of the PN junctions of the BJT rather than a turn-on of the BJT due to forward biasing of one of the PN junctions.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., FIGS. 1-4 depict a block/module including BJTs, FETs, and various regions as described herein). Such circuits or circuitry are used together with other elements to exemplify how certain embodiments may be carried out in the form of structures, steps, functions, operations, activities, etc. As another example, where the Specification may make reference to a "first FET", a "second [FET]", etc., the adjectives "first" and "second" are not used to connote any description of the structure or to provide any substantive meaning; rather, such adjectives are merely used for English-language antecedence to differentiate one such similarly-named structure from another similarly-named structure (e.g., "first FET configured with the BJT to collectively bias . . . " is interpreted as "FET configured to bias . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, an apparatus illustrated by FIG. 2A may be used to implement the process illustrated by FIG. 2B and not FIG. 2C. As another example, the apparatus illustrated by FIG. 2A may be used to implement both processes illustrated by FIG. 2B and FIG. 2C. Such modifications do not depart from the true spirit and scope of various aspects of the disclosure, including aspects set forth in the claims.

What is claimed is:

1. An electrostatic discharge (ESD) protection apparatus comprising:
  a bipolar junction transistor (BJT) having terminals including an emitter, a base and a collector, the BJT being configured to provide ESD protection in response an ESD event;
  a field-effect transistor (FET) having terminals including a gate, a source and a drain;
  a common base region connected to a recombination region, the common base region including a base region of the BJT and a common well layer that is in contact with the base region of the BJT and the recombination region including a junction between a portion of the common base region and the drain of the FET; and
  wherein the BJT and the FET are integrated with one another and include a common region shared by each of the BJT and the FET, and are collectively configured to, in response to an excessive but tolerable non-ESD voltage change at one or more of the terminals, bias the common base region and prevent triggering of the BJT and respective ESD protection by activating the FET and flowing hole current to the recombination region, therein causing a potential of the common base region to follow a potential of one of the terminals of the BJT, wherein the excessive but tolerable non-ESD voltage change is greater than a voltage threshold, the voltage threshold being less than an ESD trigger voltage for triggering the ESD protection and within a normal-operation voltage range of the apparatus.

2. The ESD protection apparatus of claim 1, wherein the common region is a terminal shared by each of the BJT and the FET, the terminal being the emitter of the BJT and the source of the FET and being connected to an input/output terminal, wherein the gate of the FET and the collector of the BJT are respectively connected to ground, and the base of the BJT forms part of the common base region, and wherein the excessive but tolerable non-ESD voltage change surpasses threshold voltages used for circuit operations and is less than the ESD trigger voltage set for the BJT to become activated for ESD protection and the excessive but tolerable non-ESD voltage change is associated with an input/output voltage provided at the terminal shared by each of the BJT and the FET.

3. The ESD protection apparatus of claim 1, further including a lateral BJT having terminals including an emitter, a base and a collector, wherein the lateral BJT shares the common region with each of the BJT and the FET, and wherein the recombination region is adjacent to one of the emitter or collector terminals of the lateral BJT, the lateral BJT is further configured and arranged to flow hole current to the recombination region, thereby activating the FET.

4. The ESD protection apparatus of claim 3, wherein the common base region includes a base region of the BJT and a base region of the lateral BJT.

5. The ESD protection apparatus of claim 1, further including:
  a lateral BJT having terminals including an emitter, a base and a collector, and
  P and N regions which are adjacent to the lateral BJT and form the recombination region at a junction between the P and N regions, with one of the P and N regions including the drain of the FET, wherein one of the terminals of the lateral BJT is the common region that is collectively shared by the BJT, the FET and the lateral BJT, and another of the terminals of the lateral BJT is in contact with one of the P and N regions adjacent to the lateral BJT.

6. The ESD protection apparatus of claim 1, wherein the gate of the FET is connected to one of ground and an input/output terminal configured and arranged to receive an input/output voltage corresponding to the excessive but tolerable non-ESD voltage change, wherein the excessive but tolerable non-ESD voltage change is greater than the voltage threshold that is within the normal-operation voltage range of the apparatus and is less than the ESD trigger voltage set for the BJT to become activated for ESD protection.

7. The ESD protection apparatus of claim 1, wherein the ESD protection apparatus further includes:
 another FET having terminals including a gate, a source and a drain, wherein the BJT and the other FET are integrated with one another and include another common region that is shared by the BJT and the other FET, and are collectively configured and arranged to bias the common base region and to prevent triggering of the BJT by causing the potential of the common base region to follow a potential of another terminal of the BJT in response to another excessive but tolerable non-ESD voltage change, of an opposite polarity, at the one or more of the terminals, wherein the other common region is a terminal shared by each of the BJT and the other FET, the terminal being the collector of the BJT and the source of the other FET and being connected to ground, wherein the gate of the FET and the emitter of the BJT are respectively connected to input/output terminals.

8. The ESD protection apparatus of claim 7, wherein the gate of the FET is connected to ground and the gate of the other FET is connected to the respective input/output terminal configured and arranged to receive input/output voltages corresponding to the excessive but tolerable non-ESD voltage change and the other excessive but tolerable non-ESD voltage change.

9. The ESD protection apparatus of claim 7, further including first and second lateral BJTs each having terminals including an emitter, a base and a collector, wherein:
 the first lateral BJT is configured and arranged adjacent to an emitter side of the BJT, and the common region is shared by the FET, the BJT and the first lateral BJT, and
 the second lateral BJT is adjacent to a collector side of the BJT, and the other common region is shared by the other FET, the BJT and the second lateral BJT.

10. The ESD protection apparatus of claim 1, wherein the common base region is floating or has a high-impedance load.

11. An electrostatic discharge (ESD) protection apparatus comprising:
 a bipolar junction transistor (BJT) having terminals including an emitter, a base and a collector, the BJT being configured to provide ESD protection in response an ESD event;
 a first field-effect transistor (FET) and a second FET, each of the first and second FETs having terminals including a gate, a source and a drain; and
 a common base region connected to a first recombination region and a second recombination region,
 wherein the BJT and the first FET are integrated with one another and include a first common region shared by each of the BJT and the first FET, and are collectively configured to bias the common base region to prevent triggering of the BJT by activating the first FET and flowing hole current to the first recombination region, thereby causing a potential of the common base region to follow a potential of one of the terminals of the BJT in response to an excessive but tolerable non-ESD voltage change of a first polarity at the terminal of the BJT; and
 wherein the BJT and the second FET are integrated with one another and include a second common region shared by each of the BJT and the second FET, and are collectively configured to bias the common base region to prevent triggering of the BJT by activating the second FET and flowing hole current to the second recombination region, thereby causing the potential of the common base region to follow a potential of another of the terminals of the BJT in response to another excessive but tolerable non-ESD voltage change, of an opposite polarity as the first polarity, at the terminal of the BJT, wherein the excessive but tolerable non-ESD voltage change is greater than a voltage threshold, the voltage threshold being less than an ESD trigger voltage for triggering the ESD protection and within a normal-operation voltage range of the apparatus.

12. The ESD protection apparatus of claim 11, wherein the other excessive but tolerable non-ESD voltage change includes a negative voltage value and the excessive but tolerable non-ESD voltage change includes a positive voltage value, wherein the first recombination region includes a junction between a portion of the common base region and the drain of the first FET and the second recombination region includes another junction between another portion of common base region and the drain of the second FET.

13. The ESD protection apparatus of claim 11, wherein the BJT is a PNP-type transistor, the first and second FETs are a P-type FET and the common base region is n-doped.

14. The ESD protection apparatus of claim 11, wherein the BJT is an NPN-type transistor, and the first and second FETs are an N-type FET, and the common base region is p-doped.

15. The ESD protection apparatus of claim 11, further including:
 a first lateral BJT having terminals including an emitter, a base and a collector, wherein the first recombination region is adjacent to one of the terminals of the first lateral BJT; and
 a second lateral BJT having terminals including an emitter, a base and a collector, wherein the second recombination region is adjacent to one of the terminals of the second lateral BJT and the common base region includes a base region of each of the BJT, the first lateral BJT and the second lateral BJT, wherein the excessive but tolerable non-ESD voltage change is greater than a voltage threshold that is within the normal-operation voltage range of the apparatus and is less than the ESD trigger voltage set for the BJT to become activated for ESD protection.

16. The ESD protection apparatus of claim 15, wherein the BJT is integrated with the first FET, the second FET, the first lateral BJT and the second lateral BJT, and are collectively configured and arranged to:
 bias the common base region to prevent triggering of the BJT responsive to the excessive but tolerable non-ESD voltage change of the first polarity at the terminal of the BJT by activating the first FET and flowing the hole current to the first recombination region via the first FET and the first lateral BJT, thereby causing the common base region potential to follow the potential of the terminal of the BJT; and
 bias the common base region to prevent triggering of the BJT responsive to the other excessive but tolerable non-ESD voltage change at the terminal of the BJT by activating the second FET and flowing the hole current to the second recombination region via the second FET and the second lateral BJT, thereby causing the common base region potential to follow the potential of the other terminal of the BJT.

17. The ESD protection apparatus of claim 15, further including P and N regions adjacent to each of the first and second lateral BJTs configured and arranged to form the first and second recombination regions, respectively, at a junction between the P and N regions, wherein:
- the first common region is a first terminal shared by the BJT and the first FET, the first shared terminal being the emitter of the BJT and the source of the first FET and being connected to an input/output terminal, wherein the gate of the first FET and the collector of the BJT are respectively connected to ground; and
- the second common region is a second terminal shared by the BJT and the second FET, the second shared terminal being the collector of the BJT and the source of the second FET and being connected to ground, wherein the gate of the second FET is connected to another input/output terminal.

18. An electrostatic discharge (ESD) protection apparatus comprising:
- a bipolar junction transistor (BJT) having terminals including an emitter, a base and a collector, the BJT being configured to provide ESD protection in response an ESD event;
- a first field-effect transistor (FET) having terminals including a gate, a source and a drain;
- a common base region connected to a first recombination region and including the base of the BJT; and
- a first lateral BJT having terminals including an emitter, a base and a collector, wherein the first recombination region is adjacent to one of the terminals of the first lateral BJT, and
- wherein the BJT, the first FET and the first lateral BJT are integrated with one another and include a first common region shared by the BJT, the first FET and the first lateral BJT, and are collectively configured to bias the common base region to prevent triggering of the BJT by activating the first FET and flowing hole current to the first recombination region, thereby causing a potential of the common base region to follow a potential of one of the terminals of the BJT in response to a first excessive but tolerable non-ESD voltage change of a first polarity at the terminal of the BJT, wherein the excessive but tolerable non-ESD voltage change is greater than a voltage threshold, the voltage threshold being less than an ESD trigger voltage for triggering the ESD protection and within a normal-operation voltage range of the apparatus.

19. The ESD protection apparatus of claim 18, further including:
- a second FET having terminals including a gate, a source and a drain, wherein the common base region is connected to a second recombination region; and
- a second lateral BJT having terminals including an emitter, a base and a collector, wherein the common base region further includes the base of the first lateral BJT and the base of the second lateral BJT, and the second recombination region is adjacent to one of the terminals of the second lateral BJT,
- wherein the BJT, the second FET and the second lateral BJT are integrated with one another and include a second common region that is shared by the BJT, the second FET and the second lateral BJT, and are collectively configured to bias the common base region to prevent triggering of the BJT by activating the second FET and flowing hole current to the second recombination region, thereby causing the potential of the common base region to follow a potential of another terminal of the BJT in response to a second excessive but tolerable non-ESD voltage change, of an opposite polarity as the first polarity, at the terminal of the BJT.

20. The ESD protection apparatus of claim 18, wherein the first FET and the first lateral BJT are configured and arranged to collectively contribute to the first recombination region in response to the first excessive but tolerable non-ESD voltage change and thereby cause self-biasing of the common base region, the first recombination region includes a junction between a portion of the common base region and the drain of the first FET, and the first common region includes a first terminal shared by each of the BJT, the first FET, and the first lateral BJT, the first shared terminal being the emitter of the BJT, the emitter of the first lateral BJT and the source of the first FET and being connected to an input/output terminal, wherein the gate of the first FET and the collector of the BJT are respectively connected to ground.

* * * * *